(12) United States Patent
Sun (10) Patent No.: US 7,286,379 B1
(45) Date of Patent: Oct. 23, 2007

(54) CONTENT ADDRESSABLE MEMORY (CAM) ARCHITECTURE AND METHOD OF OPERATING THE SAME

(75) Inventor: Dechang Sun, Chanhassen, MN (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/221,636

(22) Filed: Sep. 8, 2005

(51) Int. Cl.
*G11C 15/00* (2006.01)

(52) U.S. Cl. .................................... 365/49; 365/189.07

(58) Field of Classification Search ................. 365/49, 365/189.07
See application file for complete search history.

(56) References Cited

U.S. PATENT DOCUMENTS

| | | | |
|---|---|---|---|
| 6,542,391 B2 * | 4/2003 | Pereira et al. | 365/49 |
| 6,717,831 B2 * | 4/2004 | Rhee et al. | 365/49 |
| 6,747,885 B2 * | 6/2004 | Park | 365/49 |
| 6,946,903 B2 * | 9/2005 | Marshall et al. | 327/566 |
| 7,102,904 B1 * | 9/2006 | Kwack | 365/49 |

* cited by examiner

*Primary Examiner*—Hoai V. Ho
(74) *Attorney, Agent, or Firm*—Daffer McDaniel, LLP (57) ABSTRACT

An improved Content Addressable Memory (CAM) architecture and method for operating the same is provided herein. The improved CAM architecture may generally include an array of memory cells arranged into rows and columns, where each row includes a number of memory cells configured for storing one word. In particular, the number of memory cells may be coupled to a plurality of local match lines which, when combined through a hierarchy of two or more logic gates, form a match line signal for the entire word. Dynamic logic is used within a compare portion of each memory cell to reduce the occurrence of functional failures. In addition, the improved method for operating the CAM reduces power consumption and peak current, and improves timing, by eliminating the need to restore the match line voltage to a preset voltage level before each new compare operation.

17 Claims, 5 Drawing Sheets

Ternary CAM cell: various technologies

Binary CAM cell: various technologies

FIG. 7

Ternary CAM cell: various technologies

CONTENT ADDRESSABLE MEMORY (CAM) ARCHITECTURE AND METHOD OF OPERATING THE SAME

BACKGROUND OF THE INVENTION

1. Field of the Invention

This invention relates to content addressable memories (CAMs) and, more particularly, to an improved CAM architecture with substantially fewer functional failures, less power consumption, and improved timing.

2. Description of the Related Art

The following descriptions and examples are given as background only.

Content Addressable Memory (CAM) devices are typically used in applications that require the capability to quickly search for patterns stored among a group of memory cells. Just like other memory devices, a CAM is arranged as an array of memory cells, each cell being capable of storing an electric charge. These charges can be manipulated to store and recall data through the use of special control circuitry in the memory. In some cases, each memory cell may be capable of storing one of two values, depending on whether or not the cell holds a charge. The values "1" and "0" are typically used to represent the charged and uncharged states, respectively, although the opposite may be true. CAM devices configured for storing one of two possible states (i.e., a 1 or a 0) in each cell are known as "Binary CAMs." In addition to storing binary data, Ternary CAMs (or TCAMs) are configured for storing a mask bit, which may otherwise be referred to as a "wild card" or "don't care" bit. One or more mask bits may be used in a compare operation to search for a pattern having one or more unknown or "don't care" bit positions in the pattern. TCAMs are typically used in applications that benefit from increased flexibility.

In addition to a mechanism for storing data, each CAM cell may include a comparison circuit having a "compare" input signal and a "match" output signal. Typically, a column of cells share the same compare signal, while each cell outputs its own match signal. When a binary value or ternary value drives the compare input, each memory cell having the same value as the compare input activates (or "asserts") its match signal. This single-cell matching mechanism is useful for quickly finding data patterns among a plurality of cells in the memory device.

Figure 1:
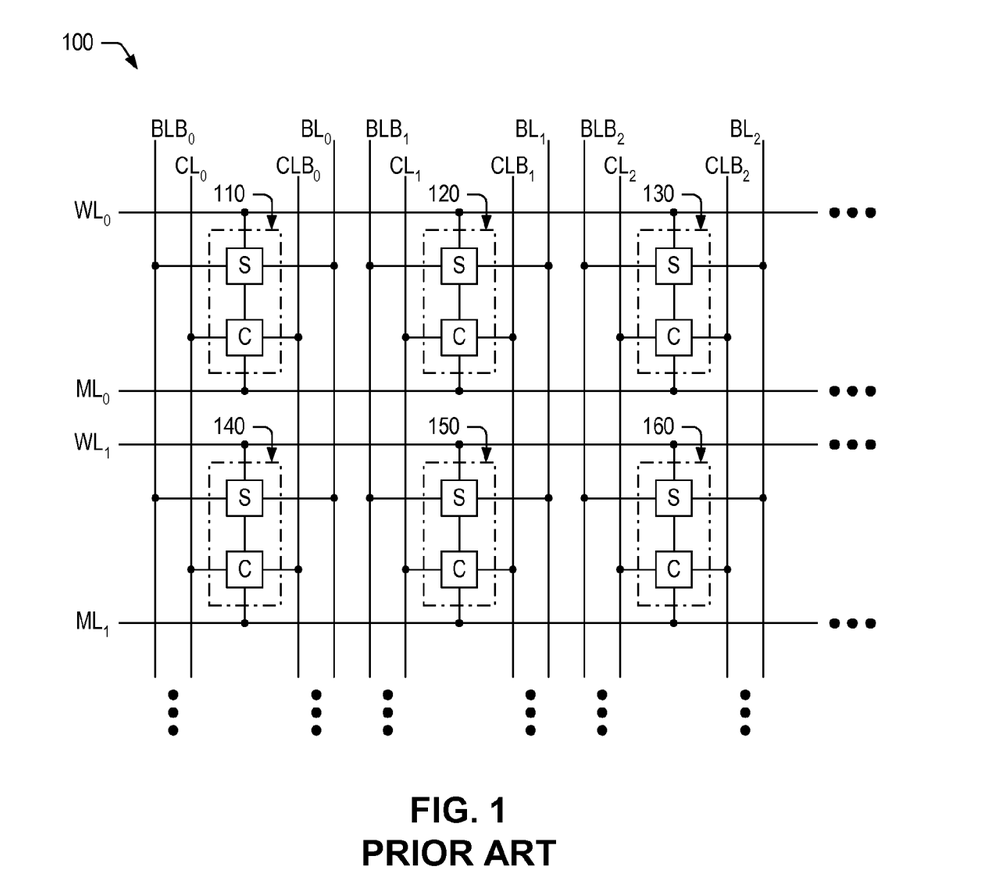
FIG. 1 is a simplified diagram of a conventional binary content addressable memory (CAM) array.

FIG. 1 illustrates an exemplary Binary CAM 100 including an array of memory cells 110, 120, 130, 140, 150 and 160. In FIG. 1, the CAM cells are organized into two rows and three columns; however, the CAM cells may be organized into substantially any other number of rows and columns, as desired. In the embodiment shown, CAM cells 110-130 represent the three columns of row 0, and CAM cells 140-160 represent the three columns of row 1. Each cell includes storage logic (S) and comparison logic (C). The storage logic (S) stores the charge that identifies the data value. Each row of cells is coupled for receiving a word line (WL) signal that activates the storage logic of each cell for reading and writing data. The CAM cells 110-130 of row 0, for example, are coupled to word line $WL_0$, while CAM cells 140-160 of row 1 are coupled to word line $WL_1$.

The storage logic (S) in each cell is coupled for receiving complementary bit line signals, which are shared with other cells in the same column. For example, CAM cells 110 and 140 of column 0 are coupled to complementary bit lines $BL_0$ and $BLB_0$, CAM cells 120 and 150 of column 1 are coupled to complementary bit lines $BL_1$ and $BLB_1$, and CAM cells 130 and 160 of column 2 are coupled to complementary bit lines $BL_2$ and $BLB_2$. To read data from a particular cell, the word line coupled to that cell is asserted, causing the cell to dump data from the storage logic onto the bit lines. To write a data value into a particular cell, the data value is placed onto the bit lines coupled to the cell. Activating the cell's word line then causes the cell to store the data value from the bit lines into the storage logic.

The comparison logic (C) in each cell is coupled to the storage logic and to a pair of complementary compare lines, which are shared with other cells in the same column. For example, CAM cells 110 and 140 of column 0 are coupled to compare lines $CL_0$ and $CLB_0$, CAM cells 120 and 150 of column 1 are coupled to compare lines $CL_1$ and $CLB_1$, and CAM cells 130 and 160 of column 2 are coupled to compare lines $CL_2$ and $CLB_2$. In each cell, the comparison logic generates a match line (ML) signal based on the data value stored within the storage logic and the compare value supplied to the compare lines. For example, a MATCH or HIT signal may be generated if the compare value matches the stored data value; otherwise, a NO MATCH or MISS signal may be generated.

Memory cells are usually accessed in groups called "words." Memory words comprise at least two contiguous cells on the same row and share a common word line, and in some cases, a common match line. The memory array shown in FIG. 1, for example, is constructed using three-bit words, including a first word consisting of cells 110-130 and a second word consisting of cells 140-160. The individual "bit match line signals" generated within each memory cell are supplied to a common match line (e.g., $ML_0$ for row 0, or $ML_1$ for row 1) to generate a match line signal for the entire word (referred to herein as a "word match line signal"). A "HIT" signal may be generated for the entire word, if the compare bit pattern exactly matches the sequence of bits in the data word. However, if at least one compare bit fails to match a respective data bit, a MISS signal will be generated for the entire word.

Figure 2:
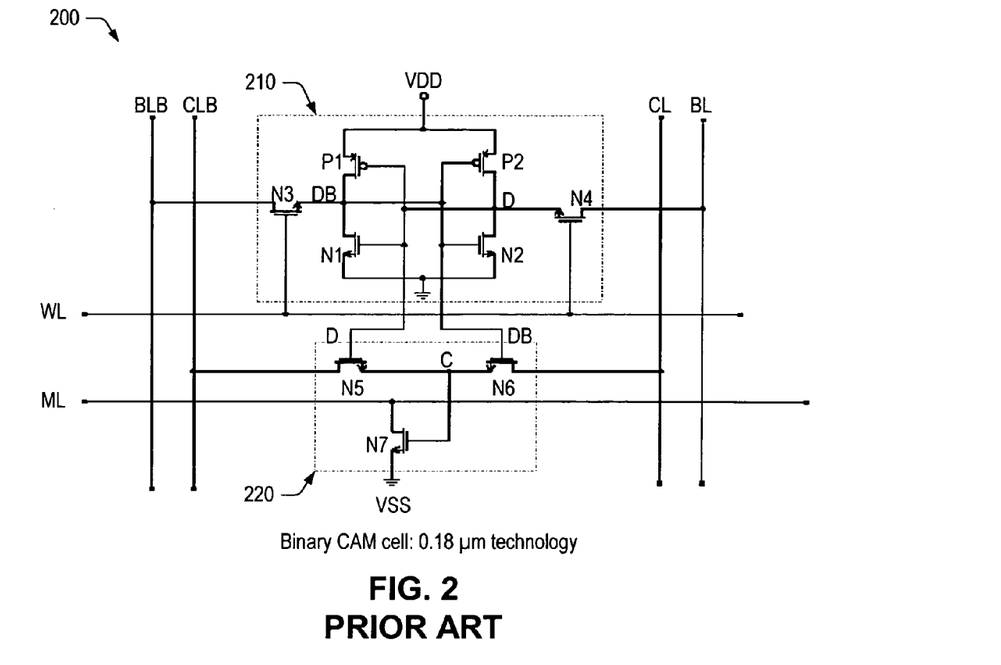
FIG. 2 is a circuit diagram of a conventional binary CAM cell that may be fabricated using 0.18 μm technology.
Figure 3:
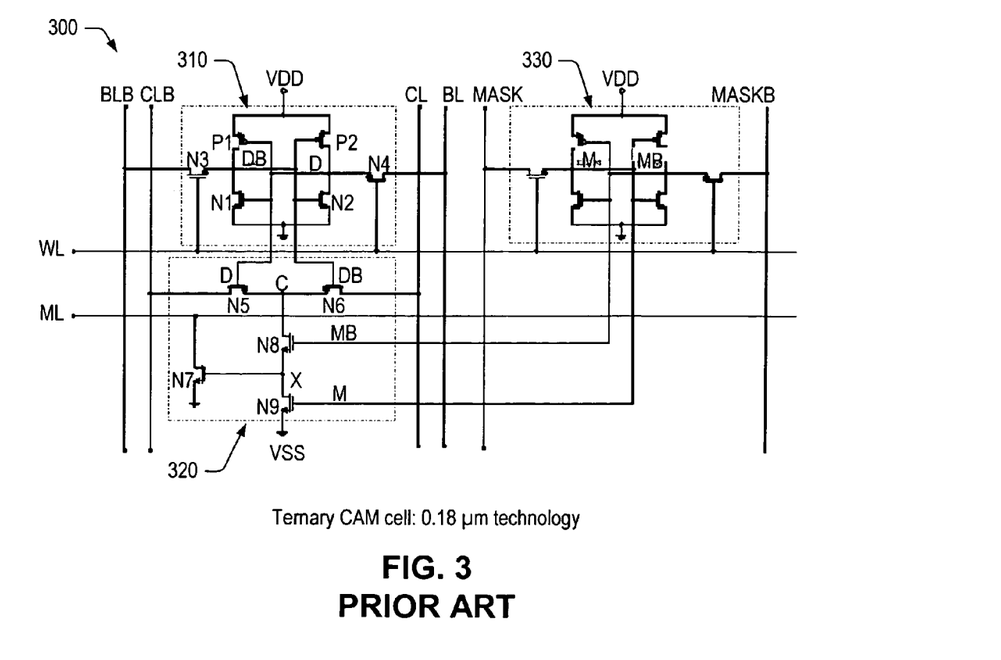
FIG. 3 is a circuit diagram of a conventional ternary CAM cell that may be fabricated using 0.18 μm technology.

FIGS. 2 and 3 illustrate conventional Binary and Ternary CAM cell architectures, respectively. As shown in FIG. 2, Binary CAM cell 200 includes storage logic 210, comparison logic 220, a word line (WL), a match line (ML), a pair of complementary bit lines (BL/BLB) and a pair of complementary compare lines (CL/CLB). The storage logic 210 includes a storage cell, or bi-stable latch, implemented with cross-coupled p-channel load transistors (P1 and P2) and n-channel latch transistors (N1 and N2). A pair of n-channel access transistors (N3 and N4) provide access to the storage nodes (D/DB) of the bi-stable latch. The comparison logic 220 includes a pair of n-channel access transistors (N5 and N6) and an n-channel match detect transistor (N7). The source-drain path of match detect transistor (N7) is coupled between the match line (ML) and ground, while the gate terminal of transistor N7 is coupled to comparison node C.

In some cases, memory cell 200 may be accessed by applying a positive voltage to the wordline (often referred to as "raising the wordline"), which activates access transistors N3 and N4. This may enable one of the two bit lines (BL/BLB) to sense the contents of the memory cell based on the voltages present at the storage nodes. For example, if storage node D is at a relatively high voltage (e.g., logic 1) and node DB is at a relatively low voltage (e.g., logic 0) when the wordline is raised, latch transistor N1 and access transistor N3 are activated to pull the bit line complement (BLB) down toward the ground potential. At the same time, the bit line (BL) is pulled up by activation of latch transistor N2 and access transistor N4. In this manner, the state of the memory cell (either a 1 or 0) can be determined (or "read") by sensing the potential difference between bit lines BL and BLB. Conversely, writing a 1 or 0 into the memory cell can be accomplished by forcing the bit line or bit line complement to either VDD or VSS and then raising the wordline. The potentials placed on the pair of bit lines will be transferred to respective storage nodes, thereby forcing the cell into either a logic 1 or 0 state.

During a compare operation, the data values stored at nodes D/DB are compared with compare values supplied to the pair of complementary compare lines (CL/CLB) for generating a match line signal (e.g., a HIT or MISS). In most cases, the match line (ML) is precharged to a logic 1 state (indicating a HIT) before the compare operation begins. If a HIT occurs during the compare operation (e.g., if the data values at node D and compare line CL are both logic 0 or both logic 1), comparison node C will be pulled to a logic 0 value, allowing the match line to remain at the precharged logic 1 level. However, if a MISS occurs (i.e., if the data values at node D and compare line CL are different), comparison node C will be logic 1 and the match line will be discharged to a logic 0 level. If the match line is shared by multiple bits, as shown in FIG. 1, the match line will be discharged to a logic 0 level if at least one bit misses.

As shown in FIG. 3, Ternary CAM cell 300 includes many of the same circuit elements included within CAM cell 200 of FIG. 2. For example, CAM cell 300 includes storage logic 310, comparison logic 320, a word line (WL), a match line (ML), a pair of complementary bit lines (BL/BLB) and a pair of complementary compare lines (CL/CLB). Storage logic 310 is similar to storage logic 210; therefore, description of storage logic 310 will not be repeated for purposes of brevity. In addition to the circuit elements included within comparison logic 220, comparison logic 320 includes n-channel transistors (N8 and N9). The source-drain paths of transistors N8 and N9 are coupled in series between comparison node C and ground. The match detect transistor N7 is activated or deactivated by the voltage present at the node (X) arranged between transistors N8 and N9.

Ternary CAM cell 300 includes another storage portion 330 for storing a complementary mask bit (M/MB) received from a pair of complementary mask lines (MASK/MASKB). When the mask bit (M) is set to logic 0 (i.e., not masked), transistor N9 will be turned off and transistor N8 will be turned on. This enables compare logic 320 to operate in a manner similar to compare logic 220. However, setting the mask bit (M) to logic 1 (i.e., masked) causes transistor N8 to turn off and transistor N9 to turn on. Activation of transistor N9 pulls node X down to ground, turning off match detect transistor N7 and maintaining the match line at it's preset voltage level to indicate a HIT (regardless of the comparison value at node C).

The CAM cell architectures shown in FIGS. 2 and 3 present many problems, especially in newer technologies with lower power supplies and diminished transistor sizes. First of all, CAM cells 200 and 300 both use n-channel transistors (e.g., NMOS) in the comparison logic portion of the cell. Because NMOS is not particularly good at passing logic 1 values, the voltage at comparison node C is not full VDD when it should be a logic 1. Instead, the voltage at comparison node C is degraded to VDD-Vth (in FIG. 2), where Vth is the threshold voltage of NMOS transistor (N5 or N6). This means that, in the case of a MISS, the match detect transistor (N7) will not be fully turned on. In some cases, the degraded voltage at node C may cause functional failures, which occur when a compare operation is miss-sensed (i.e., sensed incorrectly) as either a HIT or a MISS.

The performance of memory cell 200 may further decrease over certain process, voltage and temperature (PVT) corners (especially when the temperature is low), and is often unacceptable in newer transistor technologies. For example, although the performance of memory cell 200 may be acceptable when using 0.18 micrometer (µm) technology, the performance steadily decreases in newer technologies utilizing lower power supplies and smaller gate lengths (e.g., 0.13 µm and below). Because the transistor threshold voltage (Vth) does not drop proportionately to VDD, the threshold voltage becomes a larger percentage of VDD in newer technologies, which increases the occurrence of functional failures. The problem is exasperated in TCAM cell 300, where a series connection of two NMOS transistors further degrades the compare node C voltage to VDD−2*Vth.

Figure 4:
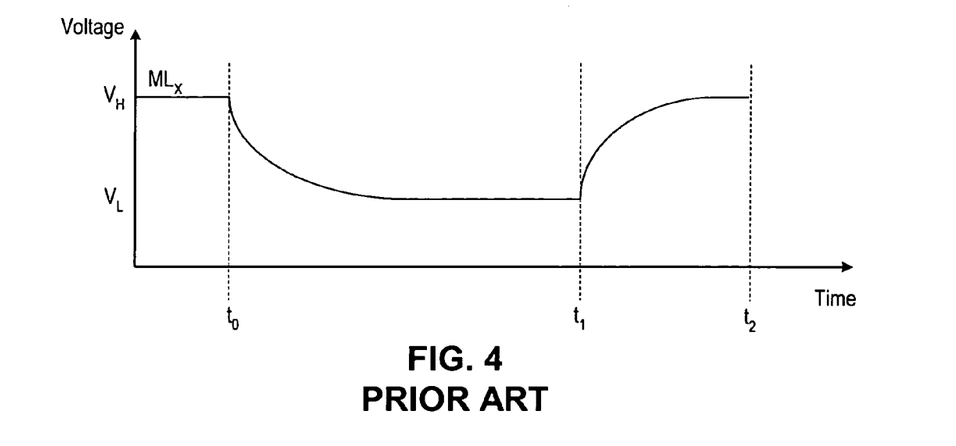
FIG. 4 is a graph illustrating the need for conventional CAM architectures to perform a compare operation by precharging, discharging and recharging (i.e., restoring) the match line to a predetermined voltage, in the case of a MISS.

Another problem with memory cells 200 and 300 is that they tend to consume a relatively large amount of power. As shown in FIG. 4, for example, each match line (ML) must be precharged to a predetermined voltage level (usually a logic high voltage level, $V_H$) before the compare operation begins. In most cases, the predetermined voltage level represents a "HIT" state, although the opposite may be true, in some cases. When the compare operation begins (at time $t_0$), the match line voltage for a given row may be discharged to a logic low voltage level ($V_L$) if at least one bit misses in the row. Near the end of the compare operation (at time $t_1$), the match line voltage is restored to the predetermined voltage level ($V_H$) in preparation for the next comparison cycle (which may begin at time $t_2$). A CAM device operates by searching all rows in parallel. Misses are much more frequent than Hits. Therefore, the architectures shown in FIGS. 2 and 3 consume a considerable amount of power by continually charging, discharging and recharging the match lines after each and every MISS.

In addition to increased power consumption, the need for restoring the match line to a predetermined state (after a MISS) complicates the design of the memory device and decreases the speed with which it operates. For example, a self-timing path is usually needed to determine when the compare operation is finished, so that the restore operation can begin. Since it takes time to perform the restore operation, timing margins are also required to account for the restore time. This undesirably increases the amount of delay within a critical path.

Additional problems arise in newer technologies as gate lengths are decreased to about 0.13 µm and below. As gate lengths get shorter, current leakage (e.g., $I_{DS}$ standby current) becomes a larger percentage of the total transistor current consumption. For example, although the current leakage may be small in the 0.18 µm technology used to form memory cells 200 and 300, it becomes a bigger problem as gate lengths decrease to 0.13 µm, and often becomes unmanageable in technologies 90 nm and below. When dynamic logic is used within the compare portion of the memory cell, as in the case of memory cells 200 and 300, more and more functional failures tend to occur as current leakage increases.

For example, a PMOS load transistor (not shown) is used in the memory cells of FIGS. 2 and 3 to precharge the match line during a precharge phase. During compare (i.e., evaluation) modes, the PMOS load transistor is turned off and NMOS transistors (e.g., N5, N6 and N7 in FIG. 2) are used to determine the state of the match line. If the comparison node is pulled to logic "0" (when a HIT occurs), transistor N7 is turned off to ensure that the match line remains at the precharged voltage level. Because the match line is not actively driven during the evaluation phase (i.e., because the PMOS precharge transistor is turned off), current leakage within transistor N7 may cause the match line voltage to decrease over time. In some cases, excessive leakage (or excessive PMOS off time) may cause the match line to be pulled down to a MISS when it should be a HIT.

Figure 5:
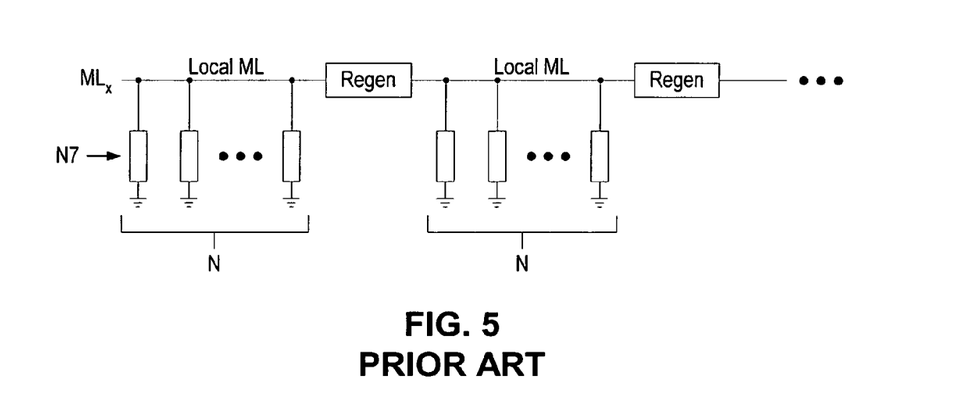
FIG. 5 is a block diagram illustrating a conventional solution to the current leakage problem, in which regeneration ("Regen") cells are inserted along the match line to buffer the match line signal and reduce current leakage.
Figure 6:
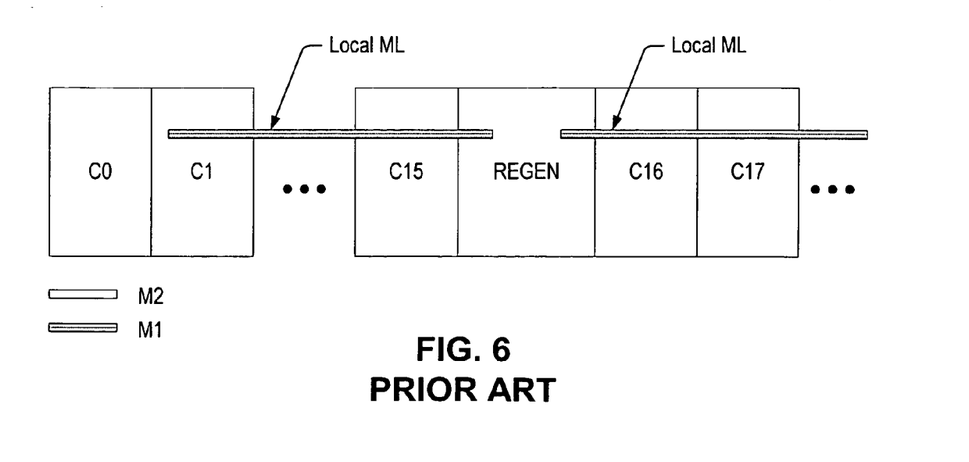
FIG. 6 is a block diagram illustrating a top view of a conventional semiconductor topography, including memory cell components and Regen cells on a metal 2 (M2) layer and local match lines on a metal 1 (M1) layer.

One solution to the current leakage problem is to insert regeneration ("Regen") cells along the match line (ML), as shown in FIGS. 5 and 6. The Regen cells are usually spaced along the match line between every N memory cells (e.g., where N=16, in the embodiment of FIG. 6). The Regen cells are used as "match line repeaters" to buffer the match line (ML) signal, since one memory cell usually cannot pull down the match line with all bits tied to it. The Regen cells are also used to reduce leakage along the match line by dividing the match line into "local match lines," each tied to only a portion of the total number of bits. Although the solution shown in FIGS. 5 and 6 may suffice in some technologies (e.g., down to about 0.13 µm the solution presents additional problems in newer technologies (e.g., 90 nm and below) where leakage constitutes a greater portion of the total transistor current consumption. For example, as gate lengths decrease, the number of Regen cells inserted along a match line can be increased to decrease the number of cells tied to each local match line. Although this may decrease the total leakage current, increasing the number of Regen cells increases the amount of area consumed by the CAM device and adds delay to the critical path.

Therefore, a need exists for an improved CAM architecture and method of operating the same. Preferably, the improved architecture and method would improve timing and reduce power consumption, the occurrence of functional failures and the complexity of the CAM device. It is also preferred that the architecture and method be applicable to a wide range of technologies, including those 90 nm and below, without sacrificing accuracy.

SUMMARY OF THE INVENTION

The following description of embodiments of CAM devices, semiconductor topographies and methods for operating a CAM device is not to be construed in any way as limiting the subject matter of the appended claims.

According to one embodiment, a Content Addressable Memory (CAM) device is provided herein. In general, the CAM device may include an array of memory cells arranged into rows and columns, where each row comprises a number of memory cells configured for storing one word. In some cases, the number of memory cells may range between about 2 and about 512 memory cells per word. Regardless of the particular number used, the number of memory cells may be coupled to a plurality of local match lines (i.e., "bit match lines") which, when combined through a hierarchy of two or more logic gates, form a match line signal for the entire word.

For example, each memory cell in the array may include a storage portion, a compare portion, a pair of complementary bit lines, a pair of complementary compare lines, a word line and a local match line. Like previous designs, the storage portion may include a pair of storage nodes for storing a pair of data bits received from the pair of complementary bit lines. The compare portion may then be used for comparing the stored data bits to a pair of compare bits received from the pair of complementary compare lines, and for generating a bit match line signal in response thereto.

Unlike previous designs, which typically include NMOS transistors, the present invention may include a pair of full pass gates within the compare portion of the CAM cell. For example, source-drain paths of the full pass gates may be coupled in series between a respective pair of complementary compare lines, while gate terminals of the full pass gates are coupled to the pair of storage nodes. The use of full pass gates reduces the occurrence of functional failures typically caused by voltage degrading NMOS transistors in the compare portion.

Unlike previous designs, which supply the individual bit match line signals to a common match line, the present invention uses a hierarchy of logic gates to logically combine the bit match line signals into a match line signal for the entire word (i.e., a word match line signal). In some cases, the hierarchy of logic gates may include one or more levels alternately consisting of NAND gates followed by NOR gates, depending on the number of memory cells used for storing one word and the number of inputs supplied to each gate. The hierarchical generation of a word match line enables a number of bit match lines to be combined (e.g., between 2 and 512 bit match lines) without using an excessive number of metal tracks to route the bit match lines together. For example, consider the case in which bit match line signals corresponding to a 32-bit word are combined into a word match line signal. If the 32 bit match lines were combined at the same level, a 32-input logic gate would be needed along with 32 metal tracks for routing the bit match line signals to the logic gate. The hierarchical method described herein reduces the number of metal tracks to 5 (for a 32-bit word) and enables more realistic logic gates to be used (e.g., 2 or 3-input gates).

According to another embodiment, a method is provided herein for performing a compare operation within a Content Addressable Memory (CAM) device, as described above. In some cases, the method may begin by supplying a compare word, comprising a number of compare bits, to a pair of compare lines coupled to a row of memory cells. Next, the method may compare each bit of the compare word to a data word comprising a similar number of data bits, which are stored within the row of memory cells. Finally, a match line signal may be generated for the row of memory cells, based on the bit-by-bit comparison between the compare word and the data word. The match line signal may assume one of two voltage levels to indicate: (i) a MATCH (or HIT) condition when all bits of the compare word match the data word, or (ii) a NO MATCH (or MISS) condition when at least one bit in the compare word mismatches with a bit in the data word.

If the match line signal is identical to a preceding match line signal, the method may include maintaining a match line associated with the row of memory cells at a previous voltage level and repeating the step of comparing once a next compare word is supplied to the row. Otherwise, the method may include forcing the match line to a second voltage level, logically different from the previous voltage level, and repeating the step of comparing once a next compare word is supplied to the row without restoring the match line to the previous voltage level. Therefore, the method ensures that the match line voltage changes state (i.e., voltage level) only when the results of a compare operation differ from those obtained in the preceding compare operation (e.g., if a HIT occurs after a MISS, or vice versa).

The method described above is different from previous methods, which require the match line voltage to be restored to the previous voltage level (e.g., a preset logic H level) after a MISS occurs. By simply toggling the match line voltage between HIT and MISS states, the present invention reduces power consumption and peak current and improves the timing of the compare operation over previous designs, which continually charge, discharge and recharge the match line for every MISS that occurs. The complexity of the CAM device is also reduced, since a self-timing path is no longer needed to detect the end of a compare operation.

According to yet another embodiment, a semiconductor topography is provided herein including a semiconductor layer and a plurality of Content Addressable Memory (CAM) cells aligned in a row. In general, the plurality of CAM cells may include a plurality of transistors formed within the semiconductor layer, a plurality of bit lines and a plurality of compare lines formed within a first metal layer arranged above the semiconductor layer, and a plurality of word lines formed within a metal layer arranged either above or below the first metal layer.

In addition to bit lines, compare lines and word lines, the semiconductor topography may include a plurality of local match lines (also referred to herein as "bit match lines") formed within a second metal layer, which is vertically spaced from the first metal layer. The local match lines may be coupled for receiving a bit match line signal from each CAM cell in the row. In some cases, a plurality of upper level match lines may be formed within a third metal layer, which is vertically spaced from both the first and second metal layers. For example, the upper level match lines may be coupled for receiving "upper level match line signals" produced by the logical combination of the bit match line signals.

In some cases, the second metal layer is arranged below, and the third metal layer is arranged above, the first metal layer. This means that, in fabrication terminology, the local match lines may be routed on a metal one (M1) layer, the bit lines and compare lines may be routed on a metal two (M2) layer, and the upper level match lines may be routed on a metal three (M3) layer, along with the word lines. In other cases, the second metal layer is arranged above, and the third metal layer is arranged below, the first metal layer. In other words, the local match lines and upper level match lines may be swapped, such that the upper level match lines are routed on a metal one (M1) layer, and the local match lines may be routed on a metal three (M3) layer. In yet other cases, the local match lines and the upper level match lines may each be routed on a metal three (M3) layer, when the word lines are routed on a metal one (M1) layer.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

An improved CAM cell architecture and method for operating the same will now be described in reference to FIGS. 7-12. As described in more detail below, the improved architecture and method reduces power consumption and peak current, improves timing and decreases the complexity of the CAM device, as compared to conventional techniques. The improved architecture can also be implemented using a variety of technologies (including those 90 nm and below) without suffering the functional failures that typically occur in conventional designs.

Figure 7:
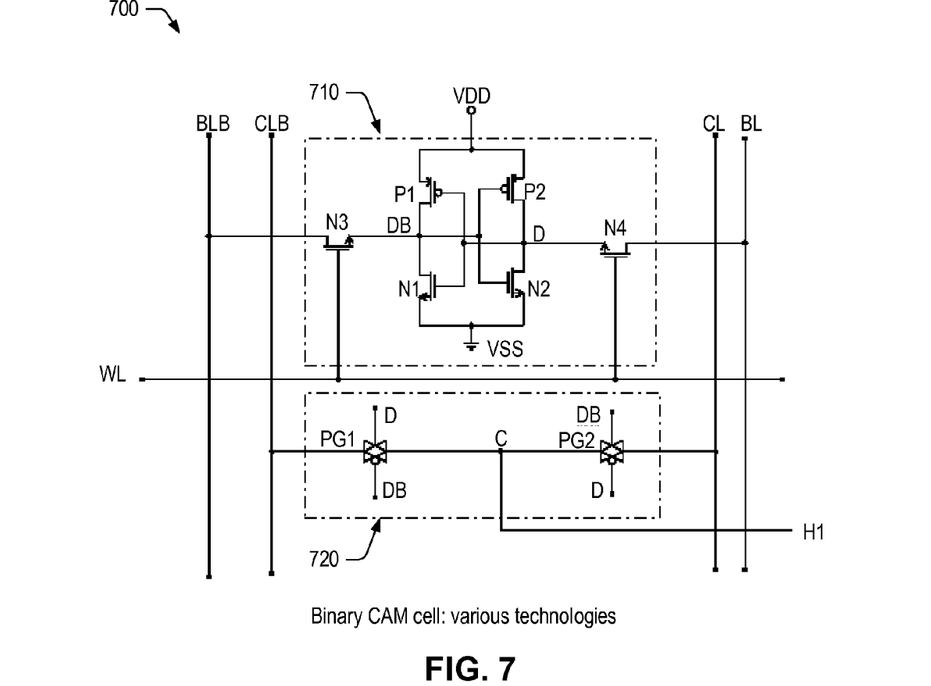
FIG. 7 is a circuit diagram of a binary CAM cell, in accordance with one embodiment of the invention.
Figure 8:
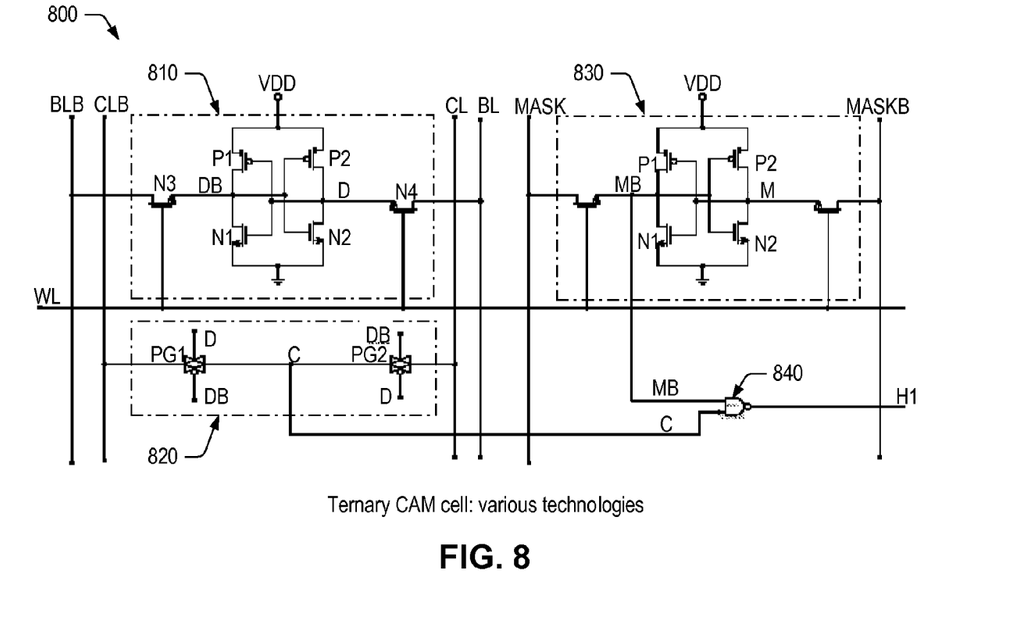
FIG. 8 is a circuit diagram of a ternary CAM cell, in accordance with one embodiment of the invention.

FIGS. 7-8 illustrate exemplary binary and ternary CAM cell architectures, in accordance with one embodiment of the invention. As shown in FIG. 7, binary CAM cell 700 generally includes storage logic 710, comparison logic 720, a word line (WL), a match line (ML), a pair of complementary bit lines (BL/BLB) and a pair of complementary compare lines (CL/CLB). Like storage logic 210 and 310 of FIGS. 2 and 3, storage logic 710 includes a storage cell, or bi-stable latch, implemented with cross-coupled p-channel load transistors (P1 and P2) and n-channel latch transistors (N1 and N2). A pair of n-channel access transistors (N3 and N4) are also included within storage logic 710 to provide access to the storage nodes (D/DB) of the bi-stable latch. The read and write operations associated with storage logic 710 are similar to those described above in reference to FIG. 2.

Unlike previous embodiments, however, the compare logic portion of memory cell 700 may include a pair of full pass gates (PG1 and PG2). In the embodiment of FIG. 7, source-drain paths of the full pass gates are coupled in series between the pair of complementary compare lines (CL/CLB), and are used for generating a bit match line signal (H1) at a compare node (C) arranged between PG1 and PG2. Gate terminals of the full pass gates are coupled for receiving the bit values stored within the storage nodes (D/DB) of storage logic 710.

As shown in FIG. 8, ternary CAM cell 800 includes many of the same circuit elements included within binary CAM cell 700 of FIG. 7. For example, TCAM cell 800 includes storage logic 810, comparison logic 820, a word line (WL), a match line (ML), a pair of complementary bit lines (BL/BLB) and a pair of complementary compare lines (CL/CLB). The storage logic (710/810) and compare logic (720/820) shown in FIGS. 7-8 are similar; therefore, description of storage logic 810 and compare logic 820 will not be repeated for purposes of brevity.

It is noted that the compare logic implementations shown in FIGS. 7-8 illustrate only one manner in which an improved memory cell in accordance with the invention may be formed. Alternative implementations may exist.

Like TCAM cell 300, TCAM cell 800 includes another storage cell 830 for storing a complementary mask bit (M/MB) received from a pair of complementary mask lines (MASK/MASKB). Unlike TCAM cell 300, however, TCAM cell 800 includes a logic gate 840, which is coupled for receiving the complementary mask value from storage node MB and the compare value from compare node C, and for generating a bit match line signal (H1) in response thereto. When the complementary mask bit (MB) is set to logic 0 (i.e., if the bit is masked), the bit match line signal will assume a logic 1 state (indicating a HIT) regardless of the comparison value at node C. However, setting the complementary mask bit (MB) to logic 1 (i.e., to indicate that the bit is not masked) enables the bit match line signal to toggle between logic 1 (i.e., HIT) and logic 0 (i.e., MISS) states, depending on the comparison value at node C. When a particular bit is not masked, the comparison operation is substantially identical in binary and ternary CAMs.

During a compare operation, the data values stored at nodes D/DB are compared with compare values supplied to the pair of complementary compare lines (CL/CLB) for generating a bit match line signal (e.g., a HIT or MISS). Unlike previous designs, however, the bit match line does not need to be precharged to a predetermined voltage level (e.g., a logic 1 state indicating a HIT) before every compare operation. Instead, compare logic 710/810 compares the stored data values (D/DB) to the received compare values (CL/CLB) and produces an XNOR result at compare node C. The voltage generated at compare node C (i.e., the bit match line signal, H1) may be logic 1 in the case of a HIT or logic 0 in the case of a MISS.

As described in more detail below, the bit match line signal (H1) may be combined with other bit match line signals in the same row to generate a word match line signal (ML). A HIT signal may be generated for the entire word, if the compare bit pattern exactly matches the sequence of bits in the data word. However, if at least one compare bit fails to match a respective data bit, a MISS signal will be generated for the entire word.

Instead of restoring the match line voltage to a predetermined voltage level at the end of each compare operation, the current design simply toggles between logic 1 and logic 0 states to indicate a HIT or a MISS. For example, FIG. 9 includes various waveforms to illustrate how the word match line (ML) voltage may toggle between logic states to change match states. At the very most, the word match line voltage may toggle once per compare operation and is generally dependent on a previous state of the match line (e.g., a previous HIT or MISS). For example, if the previous compare operation resulted in a HIT, but the current operation resulted in a MISS, the word match line voltage may transition from a relatively high voltage level (i.e., $V_H$ or logic 1) to a relatively low voltage level (i.e., $V_L$ or logic 0) at the beginning of the current compare cycle (i.e., at time $t_0$), as shown in waveforms 900 and 910. Unlike previous designs, which require the match line voltage to be restored to a predetermined voltage level, the improved design allows the match line voltage to remain at the low voltage level for the remainder of the compare cycle.

Figure 9:
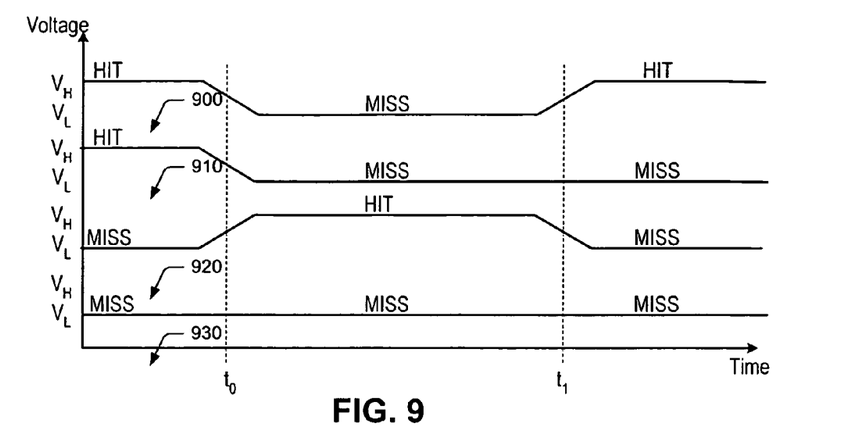
FIG. 9 is a graph illustrating an improved compare operation with reduced power consumption and improved timing, in accordance with one embodiment of the invention.

At the beginning of the next compare cycle (i.e., at time $t_1$), the match line voltage may remain at the low voltage level if another MISS occurs (as shown in waveform 910), or transition to the high voltage level if a HIT occurs (as shown in waveform 900). Waveform 920 shows the match line voltage toggling between MISS/HIT/MISS states, while waveform 930 shows the match line voltage remaining in a MISS state over consecutive compare cycles.

The memory cell architectures and method shown in FIGS. 7-9 reduce power consumption, reduce peak current and improve timing by not requiring that the match line voltage be restored to a predetermined voltage level after a MISS. The power consumption and peak current depend on the number of bits that toggle from one voltage level to the other. A worst-case scenario for power consumption and peak current occurs when all bits toggle from one state to the other. There is a high possibility for a worst-case scenario to occur in previous designs, since it is much more common for a MISS to occur (which requires discharging and restoring of the match line) than a HIT. However, it is much less common for a worst-case scenario to occur in the improved design, since it is unlikely that a particular match line will continually toggle between consecutive HIT and MISS states (e.g., HIT/MISS/HIT/MISS, etc.). Even if this were to occur (unlikely as it is), the amount of power consumed by the improved design may be approximately 50% less than the power consumption of previous designs.

Since no restore is required, timing margins associated with the conventional restore process are eliminated in the improved design, thereby decreasing the delay in the critical timing path. In addition, the complexity of the CAM device is decreased, because a self-timing path is no longer needed to determine the end of a compare operation (so that a restore operation may begin).

The memory cell architectures shown in FIGS. 7 and 8 also reduce and/or eliminate functional failures that typically occur when NMOS transistors are used in the compare logic portion of the memory cell. As noted above, the improved design may utilize a pair of full pass gates in the compare logic portion. A full pass gate (otherwise referred to as a "CMOS transmission gate") is essentially a parallel combination of NMOS and PMOS transistors with complementary gate signals. Unlike NMOS transistors, full pass gates allow an input signal to be transmitted to the output without threshold voltage attenuation. Using full pass gates within compare logic 720/820 allows the voltage at comparison node C to be fill VDD when it should be a logic 1. As such, the improved design reduces and/or eliminates functional failures associated with previous designs, which use voltage degrading NMOS transistors (e.g., N7 of FIG. 2) within the compare portion of the memory cell.

Functional failures are further reduced by the manner in which the full pass gates are used to generate a bit match line signal. For example, FIGS. 7-8 show that the source-drain paths of the fill pass gates (PG1 and PG2) are coupled between the compare lines (CL/CLB), while the gate terminals of the full pass gates are coupled to the storage nodes (D/DB) of the cell. During compare operations, bit match line signals (H1) are generated at the compare node (C) arranged between PG1 and PG2. Each of the full pass gates (PG1 and PG2) includes an NMOS transistor and PMOS transistor coupled in parallel. When one transistor of the pair is turned off, the other transistor is conducting to drive the compare node (C), and thus, the bit match line voltage, to one of the two logic states. This static design is an improvement over the dynamic architectures used in conventional CAM cells (such as CAM cells 200 and 300), which fail to actively drive the match line voltage during compare operations. Though current leakage within the compare portion may exist in both designs, the static implementation provided herein reduces functional failures by not allowing the current leakage to significantly impact the match line voltage.

As noted above, the bit match line signals (H1) generated by each memory cell in a given word may be combined through a hierarchy of logic gates to form a word match line signal. In some embodiments, the hierarchy of logic gates may include one or more levels alternately consisting of NAND gates followed by NOR gates, depending on the number of memory cells used for storing one word. One example of a two level hierarchy is shown in FIG. 10 and described in more detail below.

Figure 10:
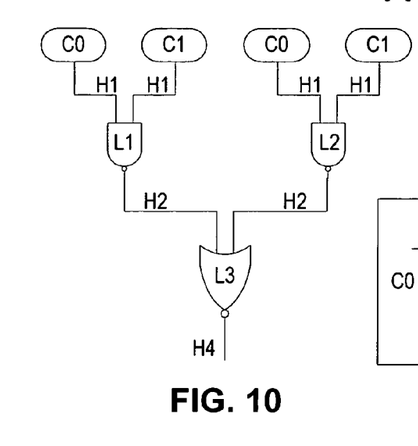
FIG. 10 is a logic diagram, according to one embodiment of the invention, in which a word match line signal is generated in a hierarchical manner by logically combining a plurality of bit match line signals received from a number (e.g., 4) of memory cells associated with one word.

Although not shown for the purpose of brevity, alternative embodiments of the invention may include fewer levels, or a greater number of hierarchical levels, than shown in FIG. 10. The number of hierarchical levels included is generally dependent on the number of memory cells used for storing one word. For example, only one level may be needed to generate a word match line signal for a 2-bit word. On the other hand, two levels may be needed to generate a word match line signal for a 4-bit word, while three levels are used to generate a word match line signal for an 8-bit word. Even though additional levels may be needed to support additional bits per word, the concepts described below may be applied to a wide range of word lengths including approximately 2-512 bits per word.

Although not shown for the purpose of brevity, alternative embodiments of the invention may also use different types of logic gates to implement the logic hierarchy. For example, instead of the logic hierarchy shown in FIG. 10, a single AND gate may be used to combine the bit match line signals into a word match line signal when a small number of bits (e.g., 2-4) are included within each word. However, because the AND gate would need a number of inputs equal to the number of bits per word, it is generally slower than the two-input logic gates used in the hierarchy. In addition, logic gates with a relatively large number of inputs (e.g., 8 and above) are usually impractical or impossible to build. Therefore, the logic hierarchy shown in FIG. 10 (or one similar) may be preferred in those embodiments where speed, practicality and the number of bits are taken into account.

In the embodiment of FIG. 10, the bit match line signals (H1) from four memory cells (C0, C1, C2, C3) are logically combined through a hierarchy of logic gates to form a word match line signal (in this case, H4). In the first level of the hierarchy, a pair of two-input NAND gates (L1 and L2) are used for combining each pair of bit match line signals into a first level match line signal (H2). However, the number of logic gates included within the first level of the hierarchy is not necessarily limited to the number of logic gates shown in FIG. 10. Instead, the number of first level logic gates may generally depend on the number of memory cells used for storing each word, as well as the number of inputs supplied to each logic gate.

In the second level of the hierarchy, a two-input NOR gate (L3) is used for combining the first level match line signals (H2) into a second level match line signal (H4). Because only four memory cells are used per word, the second level match line signal is also the match line signal for the entire word. It is understood that additional logic levels (or additional inputs in the last level of the hierarchy) may be required to form a word match line signal, if a greater number of memory cells are used per word. For example, NOR gate L3 may require three inputs to accommodate six memory cells per word. On the other hand, eight memory cells per word may expand the hierarchy to four NAND gates in the first level, two NOR gates in the second level and one NAND gate in a third and final level.

Regardless of the number of memory cells per word, the first level NAND gates are configured for generating a logic 0 signal when all bit match line signals (H1) are asserted (i.e., logic 1); otherwise, a logic 1 value is generated. On the other hand, the second level NOR gate(s) are configured for generating a logic 1 signal when all first level match line signals (H2) are deasserted (i.e., logic 0); otherwise, a logic 0 value is generated. If additional levels are included (to accommodate additional memory cells per word), the additional levels may alternately consist of NAND gates followed by NOR gates. However, if a NAND gate is used in the last level of the hierarchy, an inverter may be appended to the output of the NAND gate for generating a word match line signal with the correct polarity.

Figure 11:
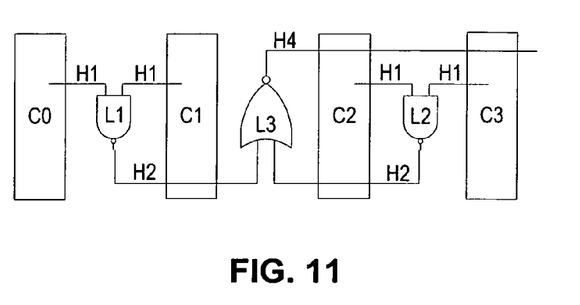
FIG. 11 is a logical block diagram, according to one embodiment of the invention, illustrating how the logical layout of FIG. 10 may be expressed in a physical layout.
Figure 12:
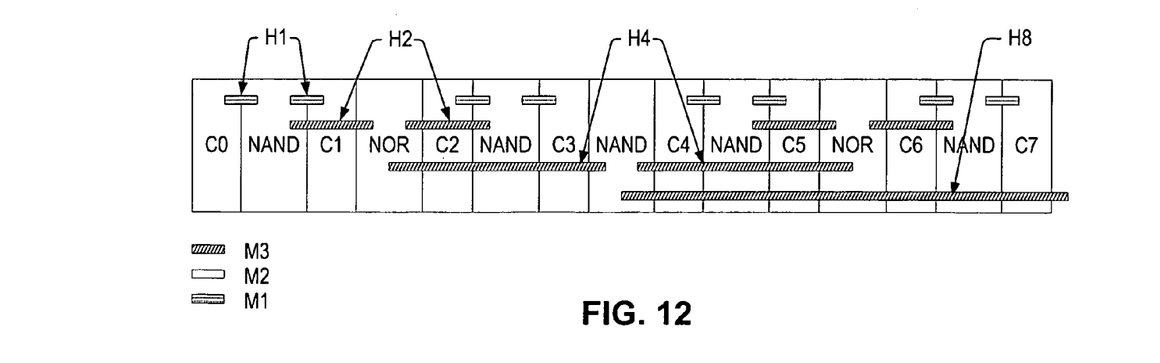
FIG. 12 is a block diagram illustrating a top view of the physical layout of FIG. 11 when viewed as a semiconductor topography, including memory cell and logic components on a metal 2 (M2) layer, bit match lines (H1) on a metal 1 (M1) layer, and upper level match lines (H2, H4, H8, etc.) on a metal 3 (M3) layer.

Reference will now be made to FIGS. 11-12 to describe how the improved CAM architecture may be fabricated using a wide range of semiconductor technologies. As shown in FIG. 11, for example, a semiconductor topography may be formed in which each logic gate in the hierarchy is arranged between a different pair of CAM cells. In the four-bit word implementation of FIGS. 10-11, NAND gate L1 is arranged between memory cells C0 and C1, NOR gate L3 is arranged between memory cells C1 and C2, and NAND gate L2 is arranged between memory cells C2 and C3. Although the arrangement shown in FIG. 11 provides the most efficient routing (of signals H1, H2 and H4), other arrangements may be used in other embodiments of the invention.

In FIG. 12, a semiconductor topography is shown comprising a row of memory cells and the hierarchy of logic components that may be used for generating a word match line signal (in this case, H8) for an 8-bit word. In particular, FIG. 12 may be used to illustrate one manner in which the bit match line signals (H1) and upper level match line signals (H2, H4, H8) may be routed within the semiconductor topography on different metallization layers.

Only the bit match lines and upper level match lines are illustrated in FIG. 12. The bit lines, compare lines and word lines associated with the CAM device are omitted from the drawing for the sake of clarity. In addition, one skilled in the art would understand that the illustrated (an non-illustrated) metal lines are formed above various underlying semiconductor layers and structures, such as, e.g., active regions, isolation regions, polysilicon structures, and contact structures, which may be used to form the NMOS, PMOS and CMOS transistors of CAM cells 700 and 800.

For example, the active regions, i.e., the areas where active transistors are to be formed, are typically embedded within a semiconductor substrate. The semiconductor substrate may be a silicon substrate doped with n-type and p-type impurities in the vicinity of the PMOS and NMOS transistors, respectively. The active regions typically include diffusion regions and isolation regions. Diffusion regions are formed within the active regions adjacent to transistor gate structures and may include, e.g., lightly doped drain regions and heavily doped source/drain regions. Dielectric isolation regions separate active regions from one another, and as such, may include field oxide regions formed by any number of techniques. The diffusion regions and isolation regions may be formed according to any method known in the art.

Each transistor includes a gate structure, which is formed above an active region, arranged between a pair of source/drain regions, and separated from the substrate by a relatively thin dielectric layer. In some cases, the gate structures may be formed from polysilicon (or "poly"), which may be deposited, e.g., by chemical vapor deposition (CVD) of silicon from a silane source, onto the thin dielectric layer overlying the substrate. Other methods of polysilicon formation are known in the art. Gate structures are not limited to polysilicon, however, and may be formed from any suitable conductive material, such as aluminum, titanium nitride, and tantalum nitride, among others. In some cases, the gate structures may include multiple layers of material, such as, e.g., a doped polysilicon and a silicide. For example, a layer of refractory metal (e.g., cobalt, nickel or titanium) may be formed upon a polysilicon layer and heated to induce a reaction between the refractory metal and the polysilicon layer. This reaction may result in the formation of a silicide, such as cobalt silicide, nickel silicide or titanium silicide.

Conductive regions and layers of the memory cell may be isolated from one another by dielectric layers. In addition to the relatively thin dielectric layer mentioned above, a relatively thick dielectric layer may be used for isolating the gate structures from an overlying metal layer. Suitable dielectrics may include silicon dioxide ($SiO_2$), tetraorthosilicate glass (TEOS), silicon nitride ($Si_xN_y$), silicon oxynitride ($SiO_xN_y(H_z)$), and silicon dioxide/silicon nitride/silicon dioxide (ONO). The dielectrics may be grown or may be deposited by physical deposition such as sputtering or by a variety of chemical deposition methods and chemistries such as chemical vapor deposition. Additionally, the dielectrics may be undoped or may be doped (e.g., with boron, phosphorus, boron and phosphorus, or fluorine) to form a doped dielectric layer such as borophosphosilicate glass (BPSG), phosphosilicate glass (PSG), and fluorinated silicate glass (FSG).

Because the conductive regions and layers of the memory cell are isolated from one another, it is often necessary to form openings in a dielectric layer to provide access to underlying regions or layers. In general, the term "contact opening" or "contact hole" may be used to refer to an opening through a dielectric layer that exposes a diffusion region, or an opening through a dielectric layer arranged between a polysilicon structure and a local interconnect. On the other hand, an opening through a dielectric layer arranged between two metal layers may be referred to as a "via." For the purposes of this disclosure, the term "contact opening" will be used to refer to a contact opening and/or a via.

In some cases, contact openings may be filled with a conductive material to form "contact structures." The contact structures provide a pathway through which electrical signals from an overlying conductive region or layer can reach an underlying region or layer of the memory cell. Though any suitable conductive material may be used, metals (such as, e.g., aluminum (Al), copper (Cu) and tungsten (W)) are generally preferred so as to minimize the resitivity of the contact structure. Many types of contact structures (e.g., self-aligned contacts and borderless contacts) may be included within the layout.

Returning to the drawings, FIG. 12 illustrates how the various match line signals (e.g., H1, H2, H4 and H8) may be routed on different metallization layers overlying the semiconductor layers described above. In some cases, only two metallization layers (e.g., M1 and M2) may be needed to form the improved CAM architecture. For example, if a word contains 2 memory cells (e.g., C0 and C1), one metal layer may be used to form one or more conductive lines associated with the CAM cell (e.g., word lines and/or bit lines), while another metal layer is used to form the match lines (e.g., bit match lines and/or word match line).

In most cases, however, three metallization layers (e.g., M1, M2 and M3) are needed to form the improved CAM architecture when more than two memory cells are used per word. For example, if a word contains 8 memory cells (as shown in FIG. 12), one metal layer may be used to form one or more conductive lines associated with the CAM cell (e.g., word lines and/or bit lines), another metal layer may be used to form the bit match lines generated by each memory cell, while yet another metal layer is used to form the interlevel match lines and word match lines of the logic hierarchy.

In one embodiment, the wordlines (WL) of the memory array may be formed within a "first metal layer" (M1). In some cases, the "first metal layer" may refer to the first conductive layer, which is dielectrically spaced above the various layers and/or structures forming the storage element of the memory cell (e.g., the NMOS, PMOS and CMOS transistors of a CAM cell). As a result, the bit lines (BL/BLB) and compare lines (CL/CLB) of the memory array may be formed within a "second metal layer" of the memory array, where the second metal layer (M2) is dielectrically spaced above the first metal layer. As noted above, the term "dielectrically spaced" refers to the formation of an interlevel dielectric layer between two conductive layers, so as to electrically isolate the two layers.

In some cases, the bit match line signals (H1) may be formed within the first metal layer, along with the word lines of the memory array. To avoid routing congestion, the interlevel match lines (e.g., H2 and H4) and word match line (e.g., H8) may be formed on a "third metal layer" (M3), which is dielectrically spaced above the bit lines and compare lines in the second metal layer. In other cases, the interlevel match line signals (e.g., H2 and H4) and word match line (e.g., H8) may be routed within M1, while the bit match line signals (H1) are routed within M3. In yet other cases, all match line signals (e.g., H1, H2, H4, H8) may be routed on M3 when the word line is routed on M1, due to the reduced availability of M1 metal tracks.

In some cases, one or more local interconnects may be formed within the first metal layer, or alternatively, within an underlying process layer. Local interconnects are often used for short connections between conductive lines, as compared to the much longer conductive lines used for global connections (such as, e.g., bitlines, compare lines, wordlines, power and ground supply lines). For example, local interconnects may be used for cross-coupling internal nodes of the NMOS, PMOS and CMOS transistors used to form the CAM cell. However, the term "local interconnect" may have multiple meanings. In some cases, the term "local interconnect" may refer to the function of connecting features within a circuit. Such a definition may be used to describe a local interconnect formed within an underlying process layer, which is not considered a "local interconnect layer" even though the process layer may perform local interconnecting functions. In other cases, the term "local interconnect" may refer to a distinct process layer, i.e., a local interconnect layer, which exclusively performs short connections between conductive lines. Forming a distinct local interconnect layer may be desired in embodiments, which strive to conserve or reduce chip-level metal layers, and is commonly used in some process technologies (e.g., 0.18 μm).

In other embodiments, one or more local interconnects may be routed within the first metal layer (M1). In such an embodiment, the bit lines (BL/BLB) and compare lines (CL/CLB) of the memory array may be formed within the second metal layer (M2). The word lines (WL) of the memory array may then be formed within the third metal layer (M3) of the memory array, which is dielectrically spaced above the second metal layer.

In some cases, the bit match line signals (H1) may be formed within the first metal layer, along with the local interconnect lines. To avoid routing congestion, the inter-level match line signals (e.g., H2 and H4) and word match line signal (e.g., H8) may be routed on the third metal layer, along with the word lines of the memory array. Alternatively, the upper level match line signals (e.g., H2, H4, H8) may be routed within M1, when the bit match line signals are routed within M3.

The hierarchical layout shown in FIGS. 10-12 provides many advantages. First, it's feasible. If a word contains a relatively large number of bits (e.g., 8 or more), a hierarchical approach to generating the word match line signal is preferred over one that uses a single logic gate with a large number of inputs. In the embodiment shown in FIG. 10, all logic gates are 2-input NAND or NOR, which are more efficient than logic gates with a greater number of inputs (e.g., 4-input logic gates). Furthermore, the hierarchical approach requires fewer metal tracks for routing the bit match line signals. For example, up to 512 bit match line signals may be routed using 9 metal tracks.

The advantages provided by the improved CAM architecture (e.g., reduced power consumption, peak current, and the occurrence of functional failures) enable the CAM device to be fabricated using a wide range of semiconductor technologies including, but not limited to, 250 nm and below. As such, the CAM architecture described herein may be used to replace conventional designs, which suffer decreased performance as gate lengths decrease to about 90 nm and below.

In addition, the reduced power consumption of the improved design provides added flexibility by allowing a circuit designer to trade off power for performance. For example, the logic gates within the logic hierarchy (e.g., L1, L2, L3 of FIGS. 10-11) may be implemented with high Vt transistors, low Vt transistors, or a combination of both, where Vt refers to the threshold voltage of the transistor. In some cases, high Vt transistors may be used to save power at the cost of speed. In other cases, low Vt transistors may be used to improve speed at the cost of increased power consumption. In yet other cases, a combination of high Vt (low leakage) transistors and low Vt (high leakage) transistors may be used to achieve the appropriate balance between power and performance. Conventional CAM cells typically use high Vt (low leakage) transistors to minimize leakage, and therefore, do not provide the flexibility afforded to the present design.

It will be appreciated to those skilled in the art having the benefit of this disclosure that this invention is believed to provide an improved CAM architecture and method of operating the same. Further modifications and alternative embodiments of various aspects of the invention will be apparent to those skilled in the art in view of this description.

It is intended that the following claims be interpreted to embrace all such modifications and changes and, accordingly, the specification and drawings are to be regarded in an illustrative rather than a restrictive sense.

What is claimed is:

1. A Content Addressable Memory (CAM) device comprising an array of memory cells arranged into rows and columns, wherein each memory cell in the array comprises a compare portion including a pair of full pass gates coupled for generating a bit match line signal at a compare node arranged between the full pass gates, wherein each compare node is coupled to a different local match line for supplying a respective bit match line signal thereto, wherein each of the different local match lines in the array is coupled to only one memory cell, and wherein the different local match lines within each row of memory cells are combined through a separate hierarchy of two or more logic gates to form a match line signal for each row of memory cells.

2. The CAM device as recited in claim 1, wherein each memory cell in the array further comprises a storage portion including a pair of storage nodes for storing a pair of data bits received from a pair of complementary bit lines.

3. The CAM device as recited in claim 2, wherein the compare portion is configured for generating the bit match line signal by comparing the stored data bits to a pair of compare bits received from a pair of complementary compare lines.

4. The CAM device as recited in claim 2, wherein source-drain paths of the full pass gates are coupled in series between a pair of complementary compare lines, and wherein gate terminals of the full pass gates are coupled to the pair of storage nodes.

5. The CAM device as recited in claim 2, wherein the compare portion is configured for continuously driving the bit match line signal during a compare operation, so that current leakage within the compare portion will not reduce a voltage level of the bit match line signal to the point of causing a functional failure.

6. The CAM device as recited in claim 1, wherein each separate hierarchy of two or more logic gates comprises a first level consisting of a plurality of NAND gates for combining the bit match line signals supplied to the local match lines of a given row into a plurality of first level match line signals.

7. The CAM device as recited in claim 6, wherein each separate hierarchy of two or more logic gates further comprises a second level consisting of at least one NOR gate for combining the first level match line signals from the NAND gates into at least one second level match line signal.

8. The CAM device as recited in claim 7, wherein the at least one second level match line signal is the match line signal for one word, if a number of memory cells used for storing one word is equal to four (4) and the two or more logic gates comprise no more than two (2) inputs each.

9. The CAM device as recited in claim 7, wherein each separate hierarchy of two or more logic gates further comprises one or more additional levels alternately consisting of NAND gates followed by NOR gates, depending on a number of memory cells used for storing one word.

10. The CAM device as recited in claim 9, wherein the number of memory cells used for storing one word comprises a range between about 2 and about 512 memory cells per word.

11. The CAM device as recited in claim 1, wherein transistors used to implement the storage portion, the compare portion and the hierarchy of logic gates are fabricated using 250 nanometer (nm) technology and below.

12. The CAM device as recited in claim 11, wherein each separate hierarchy of logic gates comprises only high-voltage threshold transistors.

13. The CAM device as recited in claim 11, wherein each separate hierarchy of logic gates comprises only low-voltage threshold transistors.

14. The CAM device as recited in claim 11, wherein each separate hierarchy of logic gates comprises a combination of high-voltage and low-voltage threshold transistors.

15. A method for performing a compare operation in a Content Addressable Memory (CAM) device comprising an array of memory cells arranged into rows and columns, the method comprising:
   comparing each bit of a compare word to a data word comprising a similar number of data bits stored within a row of memory cells, and generating a match line signal in response thereto, wherein:
     if the match line signal is identical to a preceding match line signal, the method comprises maintaining a match line associated with the row of memory cells at a previous voltage level and repeating the step of comparing once a next compare word is supplied to the row; and
     if the match line signal is not identical to the preceding match line signal, the method comprises forcing the match line to a second voltage level, logically different from the previous voltage level, and repeating the step of comparing once a next compare word is supplied to the row without restoring the match line to the previous voltage level.

16. The method as recited in claim 15, further comprising allowing the match line to toggle only once, between the first voltage level and second voltage level or vice versa, during each step of comparing.

17. The CAM device as recited in claim 1, wherein each row of memory cells is configured for storing one word, and wherein the hierarchy of two or more logic gates is configured to form a match line signal for the entire word.

* * * * *